US008817470B2

(12) United States Patent
Aoki et al.

(10) Patent No.: US 8,817,470 B2
(45) Date of Patent: Aug. 26, 2014

(54) ELECTRONIC DEVICE AND COMPLEX ELECTRONIC DEVICE

(75) Inventors: Nobumitsu Aoki, Kawasaki (JP); Hideo Kubo, Kawasaki (JP); Yoshinori Uzuka, Kawasaki (JP); Jun Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 253 days.

(21) Appl. No.: 13/447,515

(22) Filed: Apr. 16, 2012

(65) Prior Publication Data

US 2012/0201001 A1 Aug. 9, 2012

Related U.S. Application Data

(63) Continuation of application No. PCT/JP2009/067933, filed on Oct. 16, 2009.

(51) Int. Cl.
 *H05K 7/20* (2006.01)
 *G06F 1/20* (2006.01)
 *G11B 33/14* (2006.01)

(52) U.S. Cl.
 CPC .......... *H05K 7/20727* (2013.01); *G11B 33/142* (2013.01); *H05K 7/20736* (2013.01)
 USPC ................ 361/690; 361/679.48; 361/679.49; 361/679.5; 361/695; 361/697; 361/719; 361/720; 312/236

(58) Field of Classification Search
 USPC ............ 361/679.48, 679.5–679.51, 690, 692, 361/694–695; 312/236
 See application file for complete search history.

(56) References Cited

U.S. PATENT DOCUMENTS

| 3,280,377 | A | * | 10/1966 | Harris et al. ................... 361/796 |
| 5,414,591 | A | * | 5/1995 | Kimura et al. ................. 361/695 |
| 5,497,288 | A | * | 3/1996 | Otis et al. ................. 361/679.46 |
| 6,034,870 | A | * | 3/2000 | Osborn et al. ................. 361/690 |
| 6,324,056 | B1 | * | 11/2001 | Breier et al. ............. 361/679.46 |
| 6,501,650 | B2 | * | 12/2002 | Edmunds et al. ............. 361/695 |
| 6,975,510 | B1 | * | 12/2005 | Robbins et al. ............... 361/695 |
| 6,997,247 | B2 | * | 2/2006 | Malone et al. ................. 165/150 |

(Continued)

FOREIGN PATENT DOCUMENTS

| EP | 2645836 A1 * | 10/2013 | ............... H05K 7/14 |
| JP | 02-52493 | 4/1990 | |

(Continued)

OTHER PUBLICATIONS

Korean Office Action issued Aug. 22, 2013 in corresponding Korean Application No. 10-2012-7009455.

(Continued)

*Primary Examiner* — Robert J Hoffberg
(74) *Attorney, Agent, or Firm* — Staas & Halsey LLP

(57) ABSTRACT

DIMMs to be cooled are mounted in DIMM areas of a printed circuit board of a system board. An air intake port that introduces cooling air is arranged on a side plate of the system board, whereas an air discharge port that discharges the cooling air is arranged on another side plate. The cooling air flows in a direction that is oblique with respect to the side plate. The air intake port is arranged at a position that is offset in the direction in which the cooling air is supplied. Accordingly, cooling is possible by efficiently bringing the cooling air into contact with the DIMMs.

12 Claims, 19 Drawing Sheets

(56) References Cited

U.S. PATENT DOCUMENTS

| | | | |
|---|---|---|---|
| 7,033,267 B2 | 4/2006 | Rasmussen | |
| 7,068,505 B2 | 6/2006 | Kosugi | |
| 7,112,131 B2 | 9/2006 | Rasmussen et al. | |
| 7,147,042 B2 | 12/2006 | Huang et al. | |
| 7,203,063 B2 * | 4/2007 | Bash et al. | 361/699 |
| 7,227,751 B2 * | 6/2007 | Robbins et al. | 361/695 |
| 7,280,358 B2 * | 10/2007 | Malone et al. | 361/701 |
| 7,325,588 B2 * | 2/2008 | Malone et al. | 165/80.2 |
| 7,372,698 B1 * | 5/2008 | Tilton et al. | 361/701 |
| 7,447,021 B2 * | 11/2008 | Chen | 361/695 |
| 7,542,288 B2 * | 6/2009 | Lanus | 361/695 |
| 7,878,888 B2 | 2/2011 | Rasmussen et al. | |
| 7,885,062 B2 * | 2/2011 | Wagner et al. | 361/679.49 |
| 8,087,979 B2 | 1/2012 | Rasmussen | |
| 2007/0230118 A1 * | 10/2007 | Leija et al. | 361/690 |
| 2008/0257639 A1 | 10/2008 | Yamaguchi et al. | |
| 2008/0285233 A1 * | 11/2008 | Lanus | 361/695 |
| 2009/0097204 A1 * | 4/2009 | Byers | 361/695 |
| 2010/0091458 A1 * | 4/2010 | Mosier et al. | 361/695 |

FOREIGN PATENT DOCUMENTS

| | | | |
|---|---|---|---|
| JP | 02-304999 | | 12/1990 |
| JP | 03014298 A | * | 1/1991 |
| JP | 08-046381 | | 2/1996 |
| JP | 2004-235258 | | 8/2004 |
| JP | 2004-363236 | | 12/2004 |
| JP | 2006-108601 | | 4/2006 |
| JP | 2007-502027 | | 2/2007 |
| JP | 2007-188420 | | 7/2007 |
| JP | 2008-043047 | | 2/2008 |
| JP | 2008-270374 | | 11/2008 |

OTHER PUBLICATIONS

International Search Report for PCT/JP2009/067933 mailed Dec. 15, 2009.

* cited by examiner

ELECTRONIC DEVICE AND COMPLEX ELECTRONIC DEVICE

CROSS-REFERENCE TO RELATED APPLICATION

This application is a continuation of International Application No. PCT/JP2009/067933, filed on Oct. 16, 2009, the entire contents of which are incorporated herein by reference.

FIELD

The embodiments discussed herein are directed to an electronic device and a complex electronic device.

BACKGROUND

Components included in electronic devices include heat-generating components that generate heat. An increase in temperature of the electronic devices due to heat generated by the heat-generating components causes an operational abnormality in the electronic devices. Accordingly, a cooling mechanism is arranged in the conventional electronic devices. Cooling mechanisms of these electronic devices includes a liquid cooling method for circulating a liquid whose temperature is lower than that of the heat-generating components to be cooled and an air cooling method for cooling the components to be cooled by bringing cooling air into contact with them.

In the conventional air cooling method, in a casing (or a chassis) that includes a circuit boards having mounted thereon the heat-generating components, an opening is arranged at a position close to the heat-generating component and cooling air is introduced from the opening. This is because the components to be cooled are intensively cooled by locally introducing the cooling air in the vicinity of the components to be cooled.

In the conventional technology, it is assumed that the cooling air makes contact from the front with respect to the surface of the casing that includes a board having mounted thereon the heat-generating component, and thus an air intake opening is arranged at the center of the heat-generating component to be cooled.

Furthermore, the conventional technology also uses complex electronic devices in which a plurality of electronic devices are connected with each other and share the cooling air supplied to or discharged from each of the electronic devices.

Patent Literature 1: Japanese Laid-open Patent Publication No. 08-46381
Patent Literature 2: Japanese Laid-open Patent Publication No. 2006-108601
Patent Literature 3: Japanese Laid-open Patent Publication No. 2008-43047
Patent Literature 4: Japanese Laid-open Patent Publication No. 02-304999
Patent Literature 5: Japanese Laid-open Patent Publication No. 2004-235258
Patent Literature 6: Japanese Laid-open Patent Publication No. 2007-188420

However, the cooling air is not always supplied from the front with respect to the wall of the casing of the electronic device. With the conventional cooling structure that has an opening at the center of the electronic component, if the cooling air is supplied from a direction that is oblique with respect to the wall of the casing of the electronic device, the cooling air enters from the opening oblique with respect to the wall. If the cooling air enters obliquely from the opening, the cooling air effectively makes contact in the region on the downstream side of the heat-generating component to be cooled; however, the cooling air does not sufficiently make contact in the region on the upstream side. Accordingly, the cooling of the heat-generating component varies, thus reducing the cooling efficiency.

As described above, in the conventional technology, there is a problem in that the cooling efficiency is reduced when the cooling air is supplied from a direction that is oblique with respect to the wall of the casing of the electronic device.

SUMMARY

According to an aspect of an embodiment of the invention, an electronic device includes a circuit board having mounted thereon a component; a first side plate that includes an air intake port that introduces the cooling air over the circuit board; and a second side plate that includes an air discharge port that discharges the cooling air from the circuit board, wherein the first side plate includes the air intake port at a position shifted from a position closest to the component, and a direction in which the position of the air intake port is shifted corresponds to an angle of an intake stream of the cooling air with respect to the first side plate.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments will be explained with reference to accompanying drawings. In the embodiments described below, a server device will be described as an example of the complex electronic device. The server device has a system board, as an electronic device, having mounted thereon at least an arithmetic processing unit and a storage device. The arithmetic processing unit mentioned here is represented by, for example, a central processing unit (CPU), a micro processing unit (MPU), or a micro control unit (MCU). The storage device mentioned here is represented by, for example, a semiconductor memory, such as a random access memory (RAM) or a read only memory (ROM).

Furthermore, the disclosed technology is not limited to the server device or the system board; however, it can be widely used for a complex electronic device that is configured by combining electronic devices each having mounted thereon heat-generating electronic components, such as an arithmetic processing unit, a storage device, a power supply device, or the like. For example, the disclosed technology can be used for a communication device represented by a switchboard or a router. Furthermore, the disclosed technology can also be used for a personal computer having mounted thereon a motherboard.

[a] First Embodiment

Figure 1:
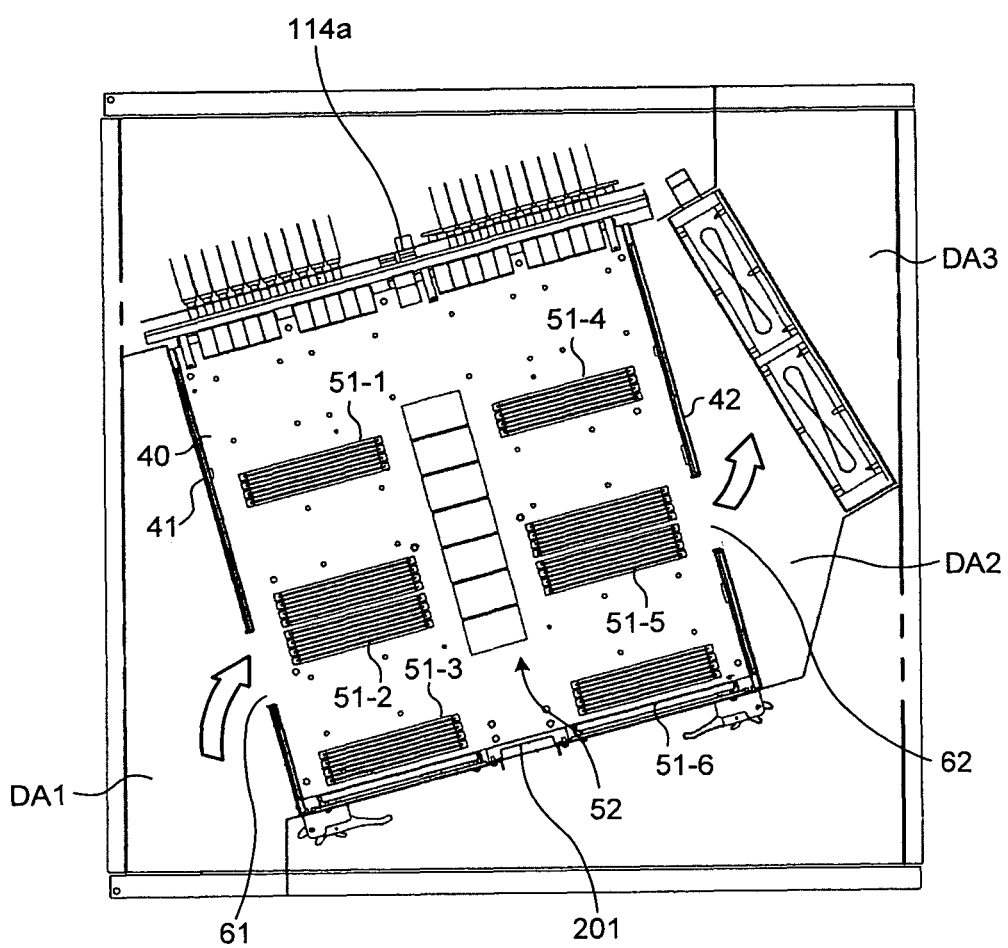
FIG. 1 is a sectional view, in the horizontal direction, of a system board that is an electronic device according to a first embodiment.

FIG. 1 is a sectional view, in the horizontal direction, of a system board that is an electronic device according to a first embodiment. A system board 201 illustrated in FIG. 1 includes, on a printed circuit board 40, a dual inline memory module (DIMM) and a power supply board 52. The DIMM is a type of RAM module in which a high integrated semiconductor memory elements are mounted on both sides of a rectangular-plate shaped circuit board and is arranged perpendicular to the printed circuit board 40.

The DIMMs are heat-generating components to be cooled by cooling air and are arranged by being distributed in DIMM areas 51-1 to 51-6. The system board 201 includes a first side plate 41 that includes an air intake port 61 for introducing cooling air over the printed circuit board 40 and a second side plate 42 that includes an air discharge port 62 for discharging the cooling air from the printed circuit board 40. In FIG. 1, the power supply board 52 is arranged at the center portion of the printed circuit board 40. The DIMM areas 51-1 to 51-3 are arranged on the side plate 41 side, and the DIMM areas 51-4 to 51-6 are arranged on the side plate 42 side. Then, the air intake port 61 is arranged in the vicinity of the DIMM area 51-2 and the air discharge port 62 is arranged in the vicinity of the DIMM area 51-5.

The system board 201 is arranged oblique with respect to a casing (or a chassis) of a server 100, i.e., the complex electronic device. The server 100 includes an air intake duct area DA1 that supplies the cooling air to the air intake port 61 that is arranged on the side plate 41 of the system board 201 and an air discharge duct area DA3 that discharges the cooling air discharged from the air discharge port 62 that is arranged on the side plate 42 of the system board 201.

Furthermore, the server 100 also includes a cooling device 113 between the air discharge port 62 arranged on the side plate 42 and the air discharge duct area DA3. The cooling device 113 is typically a fan that generates the cooling air due to rotation. Furthermore, an intermediate duct area DA2 is formed between the air discharge port 62 and the cooling device 113.

The air intake duct area DA1 supplies the cooling air at a predetermined angle that is greater than 0 degrees and less than 90 degrees with respect to the air intake port 61. The system board 201 includes the air intake port 61, on the side plate 41, at the position shifted from the position closest to the DIMM area 51-2 to the air intake duct side.

As described above, for the cooling air that is introduced obliquely relative to the front of the printed circuit board 40 to be cooled, by offsetting the opening position of the air intake port 61 in the air flow direction instead of arranging it at the center of the electronic component group to be cooled, the cooling air uniformly makes contact with the electronic components and thus the cooling can be efficiently performed.

Figure 2A:
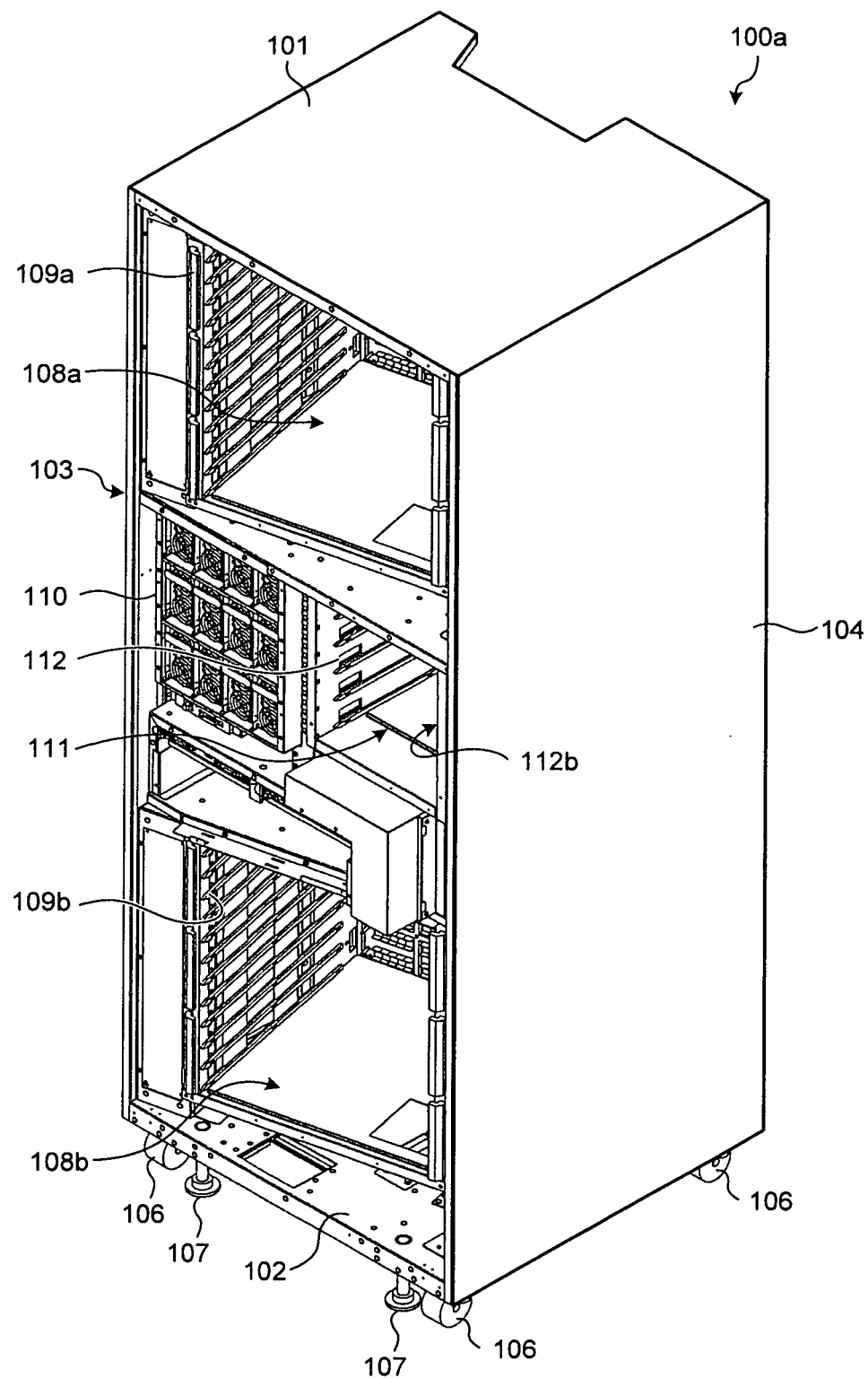
FIG. 2A is a perspective view, from the front, of a casing of a server 100.
Figure 2B:
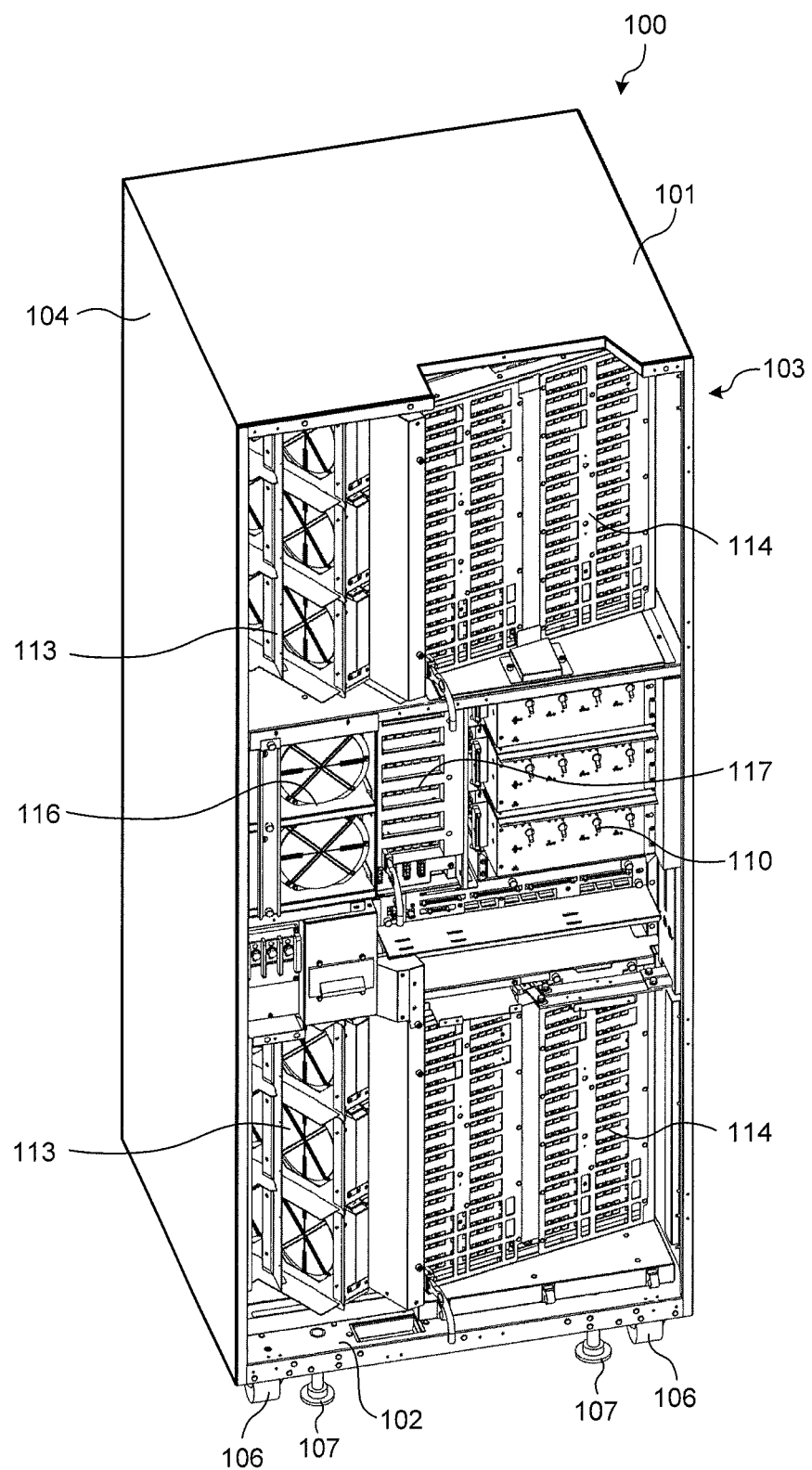
FIG. 2B is a perspective view, from the back, of the casing of the server 100.

In the following, the server 100 will be described with reference to FIGS. 2A, 2B, 2C, and 2D. FIG. 2A is a perspective view, from the front, of the casing of the server 100. FIG. 2B is a perspective view, from the back, of the casing of the server 100. FIG. 2A illustrates the state in which a front surface plate that is an openable and closable door arranged on the front side of the server 100 is removed and the front surface plate is not illustrated. Furthermore, in FIG. 2B, a back surface plate is not illustrated.

As illustrated in FIGS. 2A and 2B, the server 100 includes a top plate 101, a base plate 102, a first side surface plate 103, a second side surface plate 104, a shelf 108a, and a shelf 108b.

The base plate 102 is arranged parallel to the arrangement surface of the server 100. Furthermore, casters 106 that are used to move the server 100 and legs 107 that are used to fix the server 100 are arranged on the base plate 102.

The first side surface plate 103 and the second side surface plate 104 are arranged perpendicular to the base plate 102. The top plate 101 is arranged perpendicular to the first side surface plate 103 and the second side surface plate 104, i.e., is arranged parallel to the base plate 102.

The server 100 includes the front surface plate (not illustrated) and the back surface plate (not illustrated) that is arranged opposite the front surface plate. The front surface plate is an openable and closable door that is arranged to cover the rectangular opening, which is formed on the front surface of the server 100 and is formed by the top plate 101, the base plate 102, the first side surface plate 103, and the second side surface plate 104. The back surface plate is an openable and closable member that is arranged to cover the rectangular opening, which is formed on the back surface of the server 100 and is formed by the top plate 101, the base plate 102, the first side surface plate 103, and the second side surface plate 104.

As illustrated in FIG. 2A, the server 100 includes the shelf 108a and the shelf 108b in a space that is bounded by the first side surface plate 103 and the second side surface plate 104. The system boards 201 are arranged on each of the shelf 108a and the shelf 108b.

The shelf 108a includes a guide panel 109a that has the same number of combinations of guide rails that are arranged in parallel. Similarly, the shelf 108b includes a guide panel 109b has the same number of combinations of guide rails that are arranged in parallel.

The guide panel 109a and the guide panel 109b are arranged such that the positions of a bottom surface of the guide panel and a horizontal surface of each of the guide rails are the same and such that the guide rails are arranged perpendicular to the base plate 102.

Then, in the server 100, the shelf 108a and the shelf 108b are arranged such that the guide panel 109a and the guide panel 109b are arranged to have the angle of $\alpha°$ ($0°<\alpha<90°$) with respect to the first side surface plate 103 in the horizontal direction. By arranging the system boards 201 on the plurality of guide rails that face each other, it is possible to arrange a plurality of system boards 201 on each of the shelf 108a and the shelf 108b in a layered manner.

Furthermore, on the front surface of the server 100, an air intake duct opening is arranged in the space bounded by the shelf 108a and the first side surface plate 103. Similarly, on the front surface of the server 100, an air intake duct opening is arranged in the space bounded by the shelf 108b and the first side surface plate 103.

Furthermore, a power supply device 110 and a shelf 111 are arranged, in the vertical direction of the server 100, between the shelf 108a and the shelf 108b. The power supply device 110 is arranged on the first side surface plate 103 side, whereas the shelf 111 is arranged on the second side surface plate 104 side.

The power supply device 110 controls the power supply supplied to the electronic device arranged in the server 100 in which electronic components are mounted on a plurality of printed circuit boards. An interface board that is used by an electronic device in order to transmit and receive data to/from an external unit is arranged on the shelf 111.

The shelf 111 includes a guide panel 112 that has guide rails arranged in parallel. By arranging the interface boards on the guide rails arranged on the guide panel 112, it is possible to arrange a plurality of interface boards on the shelf 111 in a layered manner.

As illustrated in FIG. 2B, the server 100 includes connecting circuit boards 114 referred to as a back plane are arranged on the back surfaces of the shelf 108a and the shelf 108b. Each of the connecting circuit boards 114 is arranged perpendicular to the guide panel 109a. Furthermore, on the back surfaces of the shelf 108a and the shelf 108b, the connecting circuit boards 114 are arranged to cover the rectangular openings that are formed using the guide panel 109.

Each of the connecting circuit boards 114 electrically connects the system boards 201 arranged on the shelf 108a and the shelf 108b. By connecting a plurality of connecting terminals arranged on the back surface of the plurality of system boards to each of the connecting circuit boards 114, the system boards 201 are electrically connected.

Because the first side plate 41 of the system board 201 is arranged to have an angle of $\alpha°$ with respect to the first side surface plate 103 in the server 100 in the horizontal direction, each of the connecting circuit boards 114 is arranged to have an angle of $90°+\alpha°$ with respect to the first side surface plate 103 in the horizontal direction.

On the back surface of the server 100, an air discharge duct opening is arranged in the space bounded by the second side surface plate 104 and the guide panels 109a and 109b. In the server 100, the cooling device 113 is arranged in the space formed between the second side surface plate 104 and the guide panels 109a and 109b. The cooling device 113 is formed by arranging, in the vertical and the horizontal directions, a plurality of fans having the same structure. The fans are typically axial fan. The cooling device 113 is arrange to have a second angle of $\beta°$ ($0°\leq\beta\leq90°$) with respect to the first side surface plate 103.

Furthermore, in the server 100, a cooling device 116 and a connecting circuit board 117 are arranged side by side on the back surface of the shelf 111. The cooling device 116 cools electronic components mounted on the plurality of interface boards that are arranged on the shelf 111. The connecting circuit board 117 is a back plane that electrically connects a plurality of interface boards that are arranged on the shelf 111. The power supply device 110 is arranged between the connecting circuit board 117 and the first side surface plate 103.

Figure 2C:
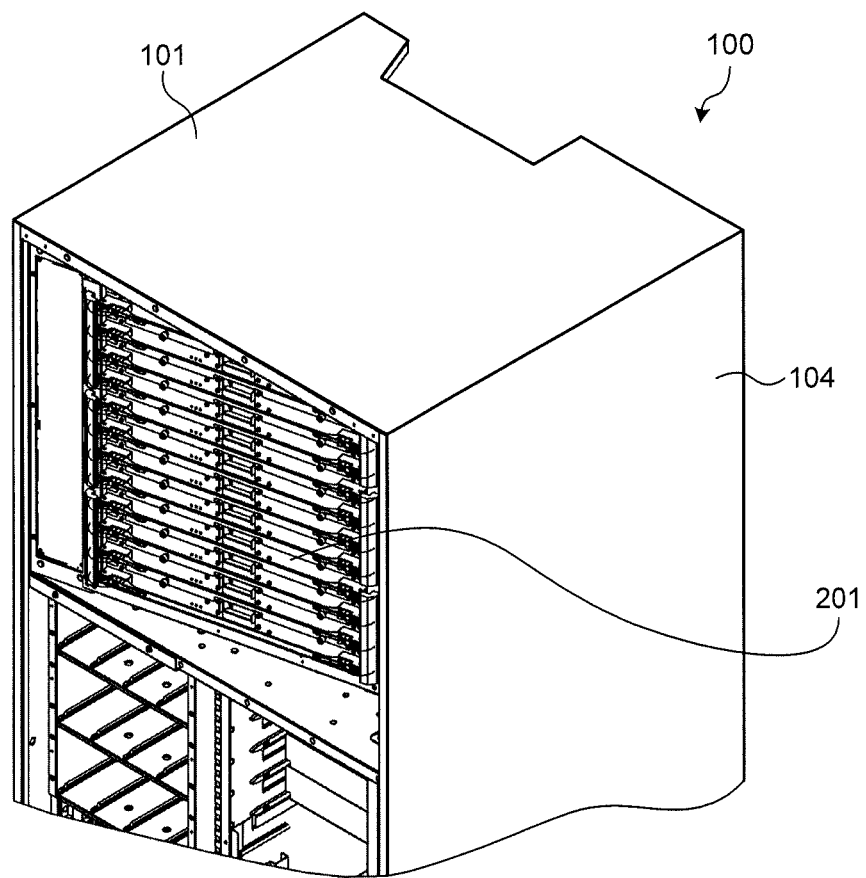
FIG. 2C is a perspective view, from the front, of a system board 201 mounted on the server 100.

FIG. 2C is a perspective view, from the front, of the system board 201 mounted on the server 100. As illustrated in FIG. 2C, the plurality of system boards 201 are arranged, on the shelf 108a, in the space formed by the top plate 101, the first side surface plate 103, and the second side surface plate 104. On the shelf 108a, the system boards 201 are arranged such that the front surfaces of the system boards 201 are aligned in the same plane. The system boards 201 are arranged in the shelf 108b in a similar manner to the shelf 108a.

Figure 2D:
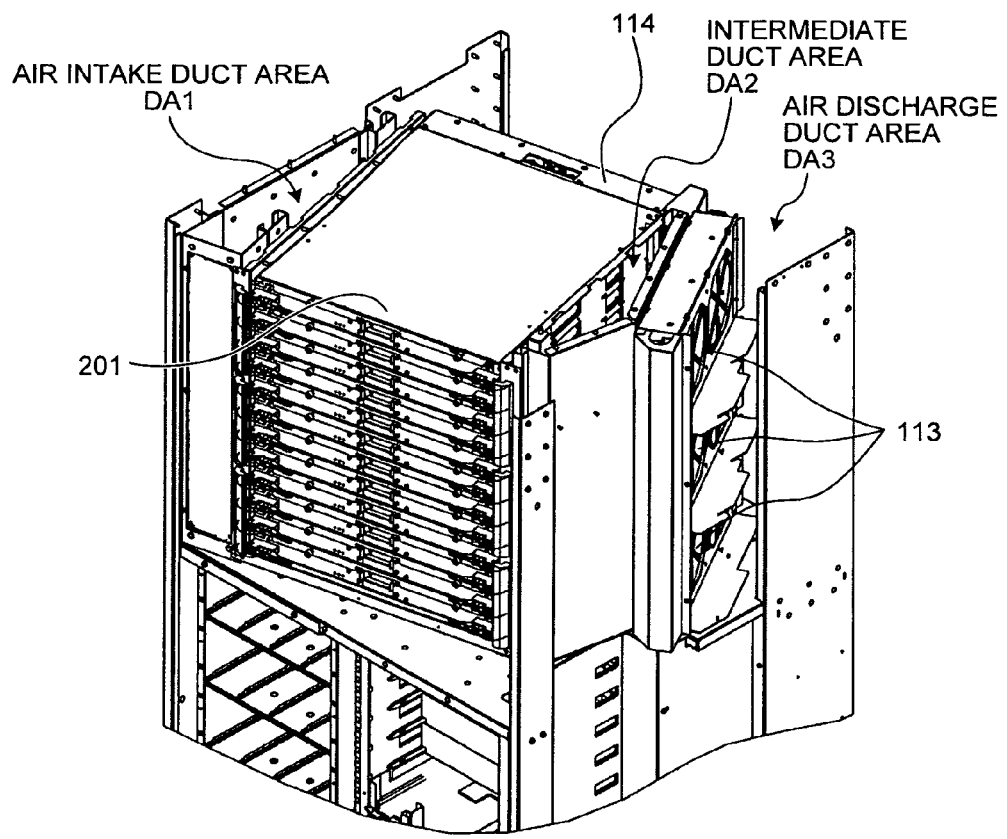
FIG. 2D is a schematic diagram illustrating a state in which a top plate 101 is removed from the state illustrated in FIG. 2C.

FIG. 2D is a schematic diagram illustrating a state in which the top plate 101 is removed from the state illustrated in FIG. 2C. As illustrated in FIG. 2D, the system boards 201 arranged on the shelf 108a are arranged such that the side plate 41 is arranged to have an angle with respect to the first side surface plate 103 in the horizontal direction and are electrically connected to each of the connecting circuit boards 114. The space bounded by the first side surface plate 103 and the guide panel 109a on the shelf 108a is an air intake duct area DA1. An air intake duct opening is arranged in the air intake duct area DA1 on the front surface of the server 100.

The cooling device 113 illustrated in FIG. 2D is arranged, in the space bounded by the shelf 108a and the second side surface plate 104, at an angle of $\beta°$ with respect to the first side surface plate 103 in the horizontal direction. The space bounded by the shelf 108a, the guide panel 109a of the shelf 108a, and the cooling device 113 is an intermediate duct area DA2.

Furthermore, the space bounded by the cooling device 113 and the second side surface plate 104 illustrated in FIG. 2D is an air discharge duct area DA3. An air discharge duct opening is arranged in the air discharge duct area DA3 on the back surface of the server 100.

In FIG. 2D, by operating the cooling device 113, the cooling air flowing from the air intake duct opening into the server 100 changes its flow direction, in the air intake duct area DA1, toward the system boards 201. Then, the cooling air that has changed its flow direction toward the system boards 201 cools inside the system boards 201 and flows over the system boards 201.

The cooling air flowing over the system board 201 changes its flow direction, in the intermediate duct area DA2, toward the cooling device 113. Then, the cooling air that has changed its flow direction toward the cooling device 113 flows through the cooling device 113 and is discharged outside of the server 100 from the air discharge duct opening via the air discharge duct area DA3.

To simplify the explanation, FIG. 1 illustrates a case in which the air intake port 61 is arranged near the DIMM area 51-2 and the air discharge port 62 is arranged near the DIMM area 51-5. However, to improve the cooling efficiency, air intake ports associated with the DIMM areas 51-1 to 51-3 and air discharge ports associated with the DIMM areas 51-4 to 51-6 are preferably arranged.

Figure 3:
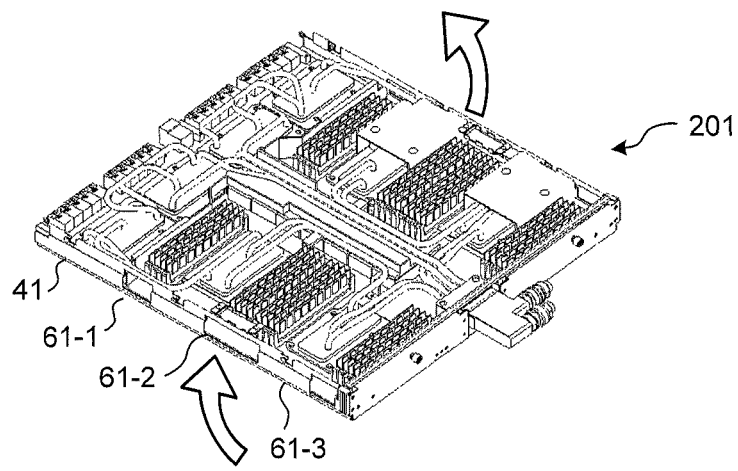
FIG. 3 is a perspective view of the system board 201 that includes air intake ports 61-1 to 61-3 associated with DIMM areas 51-1 to 51-3, respectively.

FIG. 3 is a perspective view of the system board 201 that includes air intake ports 61-1 to 61-3 associated with the DIMM areas 51-1 to 51-3, respectively. As described above, the cooling air enters obliquely relative to the front of the side plate 41 of the system board 201.

Figure 4:
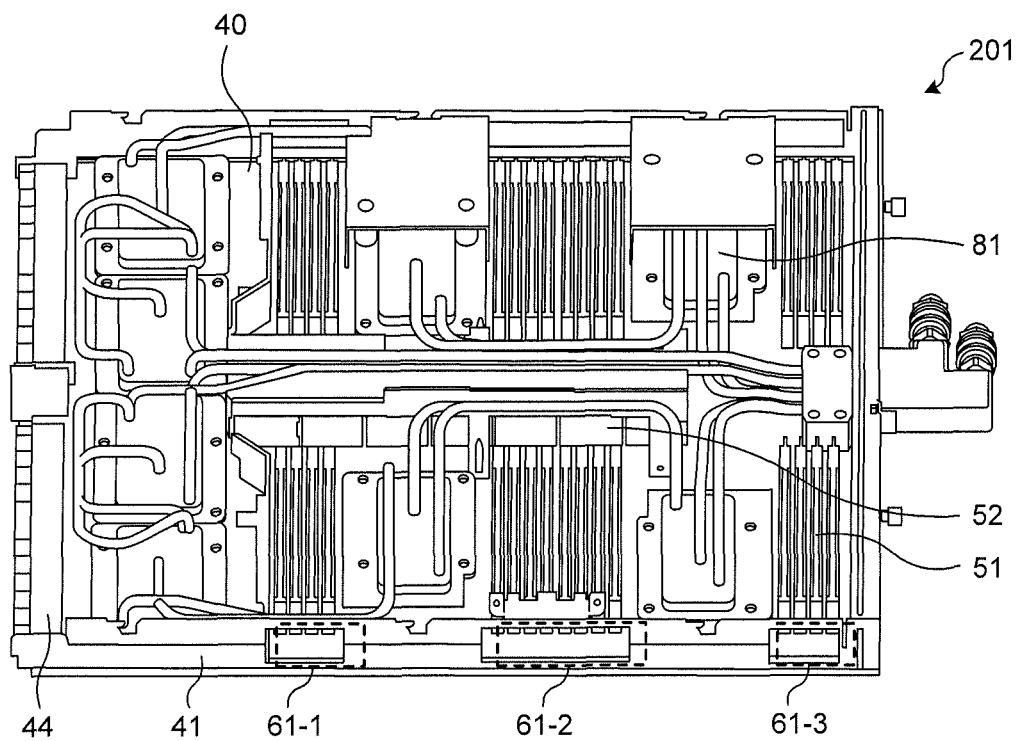
FIG. 4 is a schematic diagram illustrating, in outline, the configuration of the system board 201.
Figure 5:
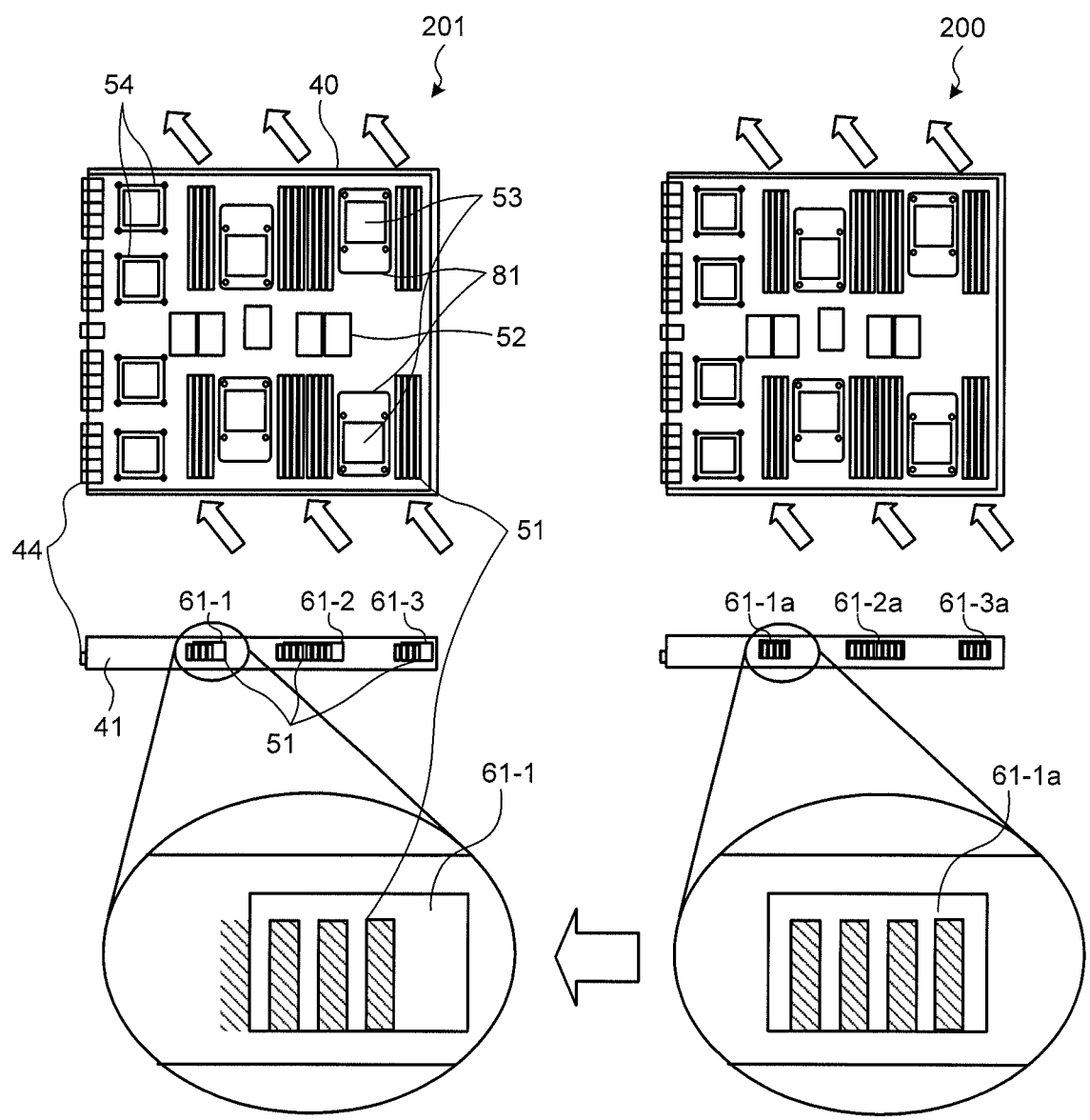
FIG. 5 is a top view of the system board 201.

FIG. 4 is a schematic diagram illustrating, in outline, the configuration of the system board 201. FIG. 5 is a top view of the system board 201. Electronic components, such as an arithmetic element 53, a communication element 54, the power supply board 52, and the like are mounted, by soldering, on the printed circuit board 40 on the system boards 201. Furthermore, a connector 44 that is connected to the connecting circuit board 114, that electrically connects to other printed circuit boards 40, and that supplies the power supply is arranged on one end of the printed circuit board 40. The side plates 41 and 42, which are formed from a sheet metal, reinforce and protect the printed circuit board 40 and are fixed using a screw or the like.

In the first embodiment, a liquid cooling method is used to cool some of the electronic components. Water cooling jackets 81 that cool heat generated by some of the electronic components, i.e., the arithmetic element 53 and the communication element 54 in the examples illustrated in FIGS. 4 and 5, are arranged. Each of the water cooling jackets 81 is in close contact with each component and is typically a water cooling tube that allows a liquid refrigerant to flow between the water cooling jackets 81. The water cooling jackets 81 are connected by water cooling tubes.

The side plate 41 on the air intake side includes the air intake port 61-1 associated with the DIMM area 51-1, the air intake port 61-2 associated with the DIMM area 51-2, and the air intake port 61-3 associated with the DIMM area 51-3. These air intake ports 61-1 to 61-3 are arranged by offsetting from the front of the DIMM area, i.e., from the position closest to the DIMM area, to the front side of the system board 201, i.e., from the upstream side of the cooling air stream.

The side plate 42 on the air discharge side includes an air discharge port 62-1 associated with the DIMM area 51-4, an air discharge port 62-2 associated with the DIMM area 51-5, and an air discharge port 62-3 associated with the DIMM area 51-6. These air discharge ports 62-1 to 62-3 is arranged on the front of the DIMM area, i.e., at the position closest to the DIMM area, without being offset.

FIG. 5 illustrates the differences of the positions of the air intake ports by comparing the system board 201 in which an air intake port is offset and a system board 200 in which an air intake port is arranged, without being offset, at the front of the DIMM area, i.e., at the position closest to the DIMM area.

When comparing, used as comparative example, the positions of air intake ports 61-1a to 61-3a on the system board 200 with the positions of the air intake ports 61-1 to 61-3 on the system board 201, the air intake ports 61-1 to 61-3 are shifted to the front side of the system board 201. Accordingly, when viewed from the front side of the side plate 41, instead of being arranged at the front of the DIMM that corresponds to the heat-generating component to be cooled, the air intake ports 61-1 to 61-3 are shifted in the direction in which the cooling air is taken in; therefore, the air intake ports 61-1 to 61-3 are located at the offset position.

Figure 6:
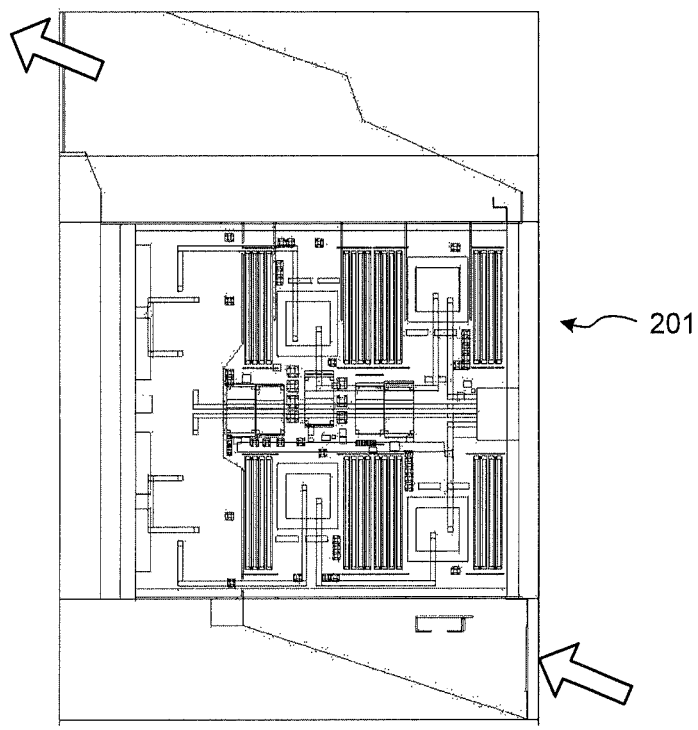
FIG. 6 is a schematic diagram illustrating a target portion for the thermal hydraulic analysis.

In the following, results of the thermal hydraulic analysis performed on the cooling air on the system board 201 will be described. FIG. 6 is a schematic diagram illustrating the target portion for the thermal hydraulic analysis. The region surrounded by the broken line illustrated in FIG. 6 is assumed to be the target portion of the thermal hydraulic analysis. Specifically, the DIMM areas 51-1 to 51-6 and the power supply board 52 are the target of the thermal hydraulic analysis. The thermal hydraulic analysis is performed in the state in which the cooling air is taken in obliquely relative to the front, passes over the printed circuit board 40, and flows in a direction oblique to the back surface.

Figure 7:
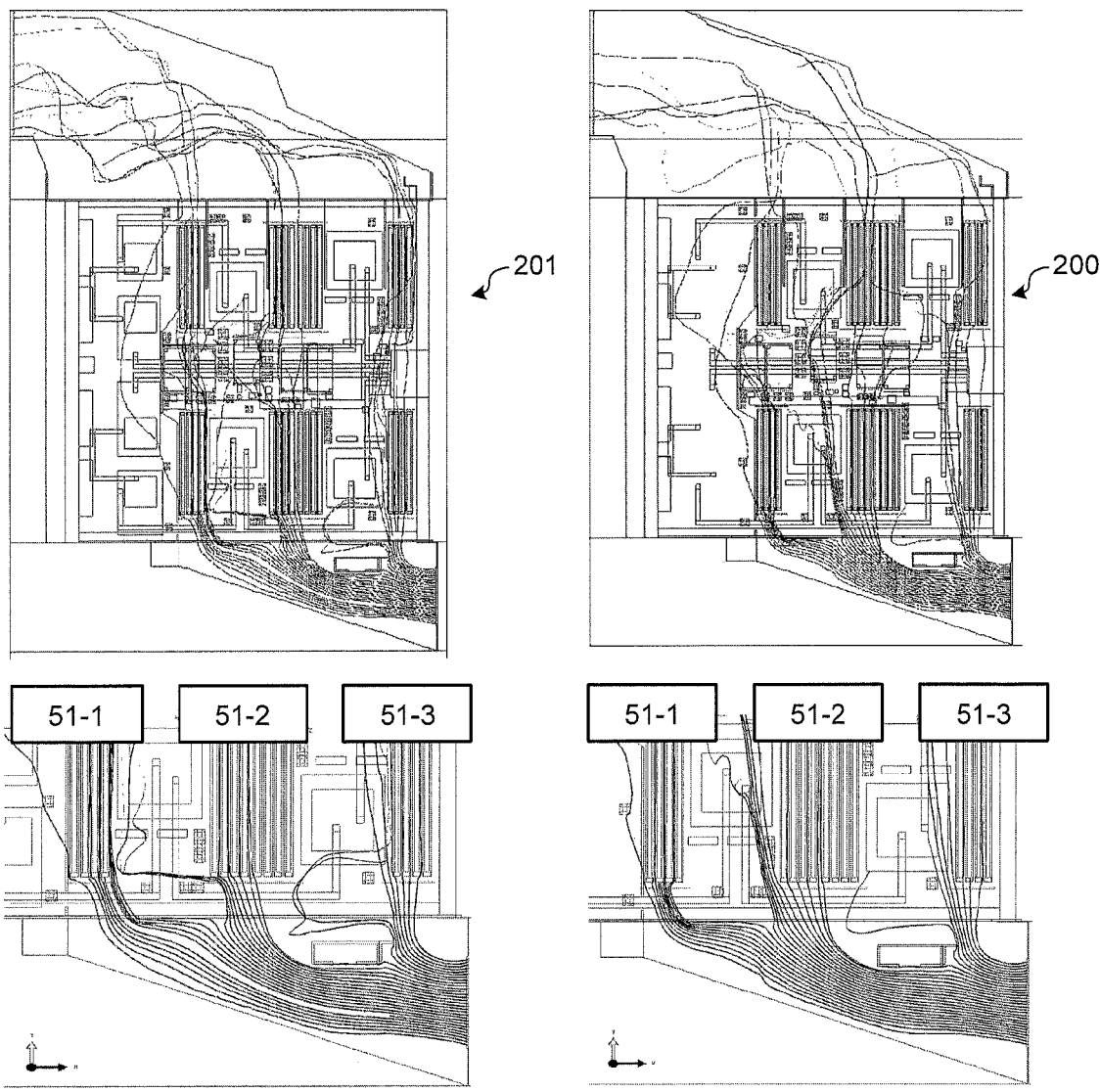
FIG. 7 is a schematic diagram illustrating the results of the thermal hydraulic analysis.

FIG. 7 is a schematic diagram illustrating the results of the thermal hydraulic analysis. FIG. 7 illustrates the flow of the cooling air is indicated by lines. As illustrated in FIG. 7, with the system board 200 in which an air intake port is not offset, a part of the cooling air flowing in the DIMM area 51-2 flows toward the DIMM area 51-1 during the flowing, and thus the DIMM area 51-2 is not effectively used in terms of the cooling.

In contrast, with the system board 200 in which an air intake port is offset, there is no cooling air that deviates from the DIMM area 51-2 into the DIMM area 51-1, and thus the cooling air is uniformly flowing in the DIMM area.

Figure 8:
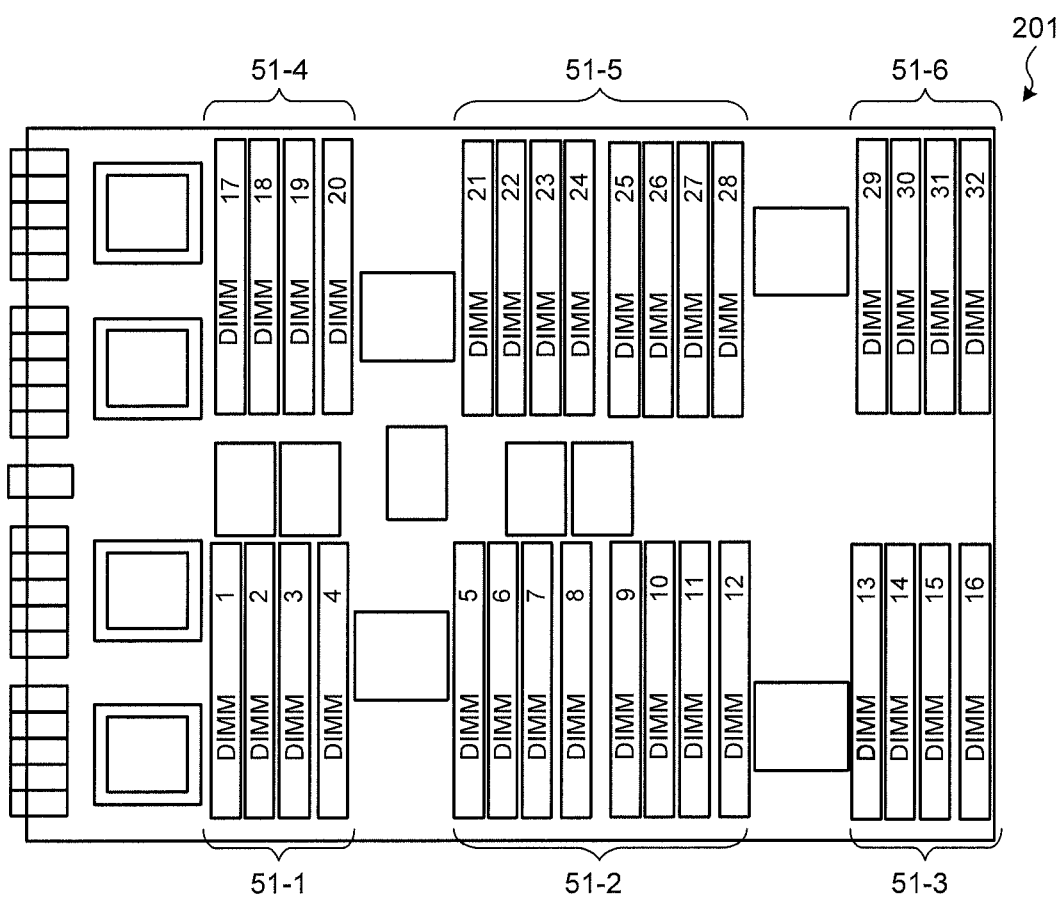
FIG. 8 is a schematic diagram illustrating DIMMs installed in the DIMM areas 51-1 to 51-6.

In the following, the improvement of the cooling effect of the DIMMs due to the offsetting of the air intake port will be described. FIG. 8 is a schematic diagram illustrating DIMMs installed in the DIMM areas 51-1 to 51-6. In the DIMM area 51-1, four DIMMs 1 to 4 are mounted; in the DIMM area 51-2, eight DIMMs 5 to 12 are mounted; and in the DIMM area 51-3, four DIMMs 13 to 16 are mounted. Similarly, in the DIMM area 51-4, four DIMMs 17 to 20 are mounted; in the DIMM area 51-5, eight DIMMs 21 to 28 are mounted; and in the DIMM area 51-6, four DIMMs 29 to 32 are mounted.

Figure 9:
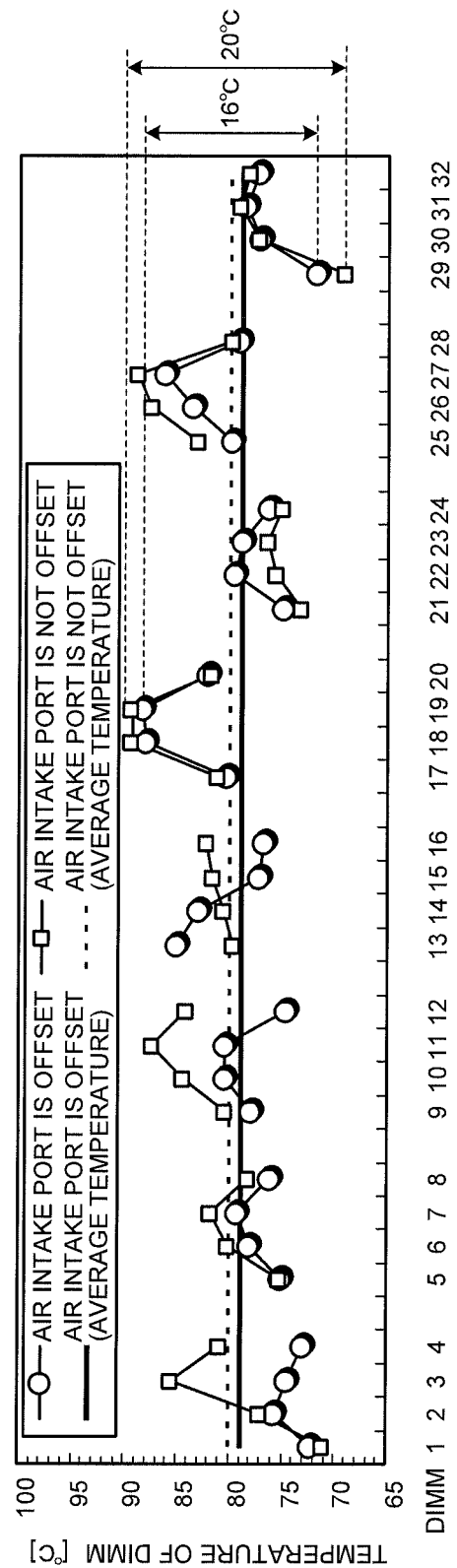
FIG. 9 is a schematic diagram illustrating the differences between cooling effects obtained when an air intake port is offset and when the air intake port is not offset.

FIG. 9 is a schematic diagram illustrating the differences between cooling effects obtained when an air intake port is offset and when the air intake port is not offset. In FIG. 9, the temperatures of the DIMMs 1 to 32 are compared between the system board 201 in which the position of the air intake port is offset and the system board 200 in which the position of the air intake port is not offset. The variation ($\Delta T$) in the temperatures between all of the DIMMs mounted on the system board 200 is 20° C., whereas the variation in the temperatures between all of the DIMMs mounted on the system board 201 is 16° C. Accordingly, the variation in the temperatures can be reduced by offsetting the air intake port.

As described above, when the server 100 and the system boards 201 according to the first embodiment introduce cooling air over the printed circuit board having mounted thereon the heat-generating components, the server 100 and the system boards 201 uses an air intake port arranged, by being offset, in the direction from the front of the heat-generating components to the cooling air stream.

Accordingly, if the cooling air is supplied from a direction that is oblique with respect to the side plate that is the wall of the system board 201, the server 100 and the system board 201 can efficiently cool the heat-generating components.

[b] Second Embodiment

Figure 10:
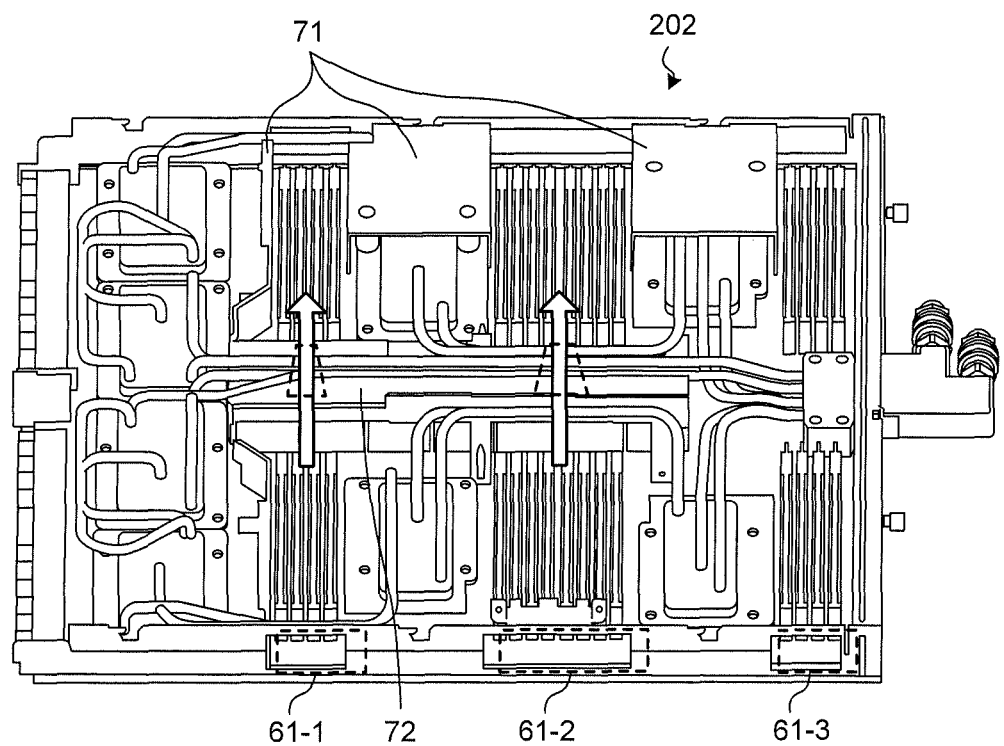
FIG. 10 is a schematic diagram illustrating the configuration of a system board that is an electronic device according to a second embodiment.

FIG. 10 is a schematic diagram illustrating the configuration of a system board that is an electronic device according to a second embodiment. The system board 202 illustrated in FIG. 10 includes ducts 71 each of which are arranged near each of the air discharge ports 62-1 to 62-3. Furthermore, a duct 72 that has an air guiding duct is arranged between the DIMM areas 51-1 to 51-3 and the DIMM areas 51-4 to 51-6 on the power supply board 52. Because the configuration of the system board 202 is the same as that of the system board 201 described in the first embodiment, components that are the same as those in the first embodiment are assigned the same reference numerals; therefore, a description thereof is omitted.

In the second embodiment, the system board 202 includes both the ducts 71 and the duct 72; however, the system board 202 may also include either one of the ducts 71 or the duct 72. First, the ducts 71 will be described.

Figure 11:
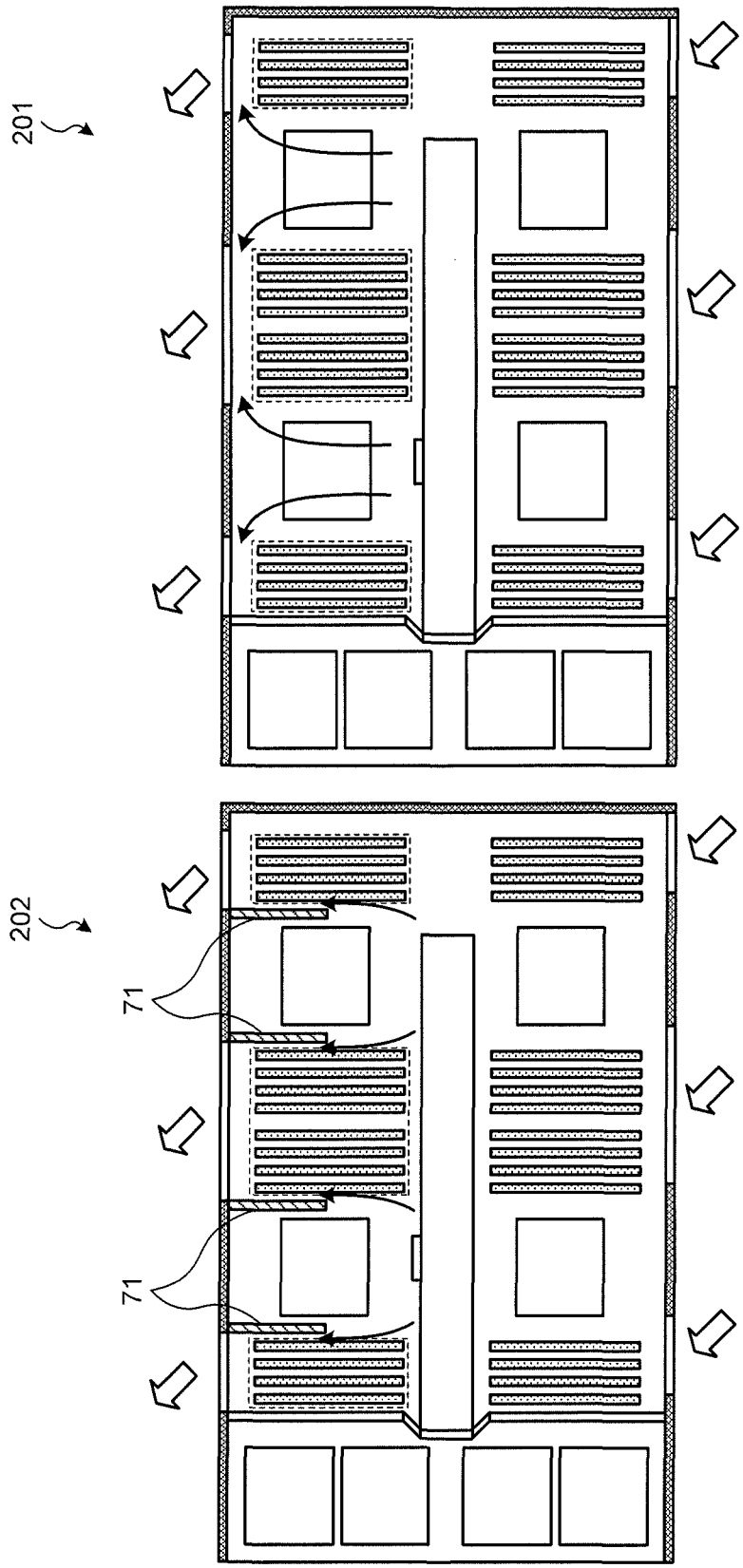
FIG. 11 is a schematic diagram illustrating a system board 202 that includes ducts 71, compared with the system board 201 that does not include a duct 71.

FIG. 11 is a schematic diagram illustrating the system board 202 that includes the ducts 71, compared with the system board 201 that does not include the duct 71. The system board 202 has the structure in which the ducts 71 are arranged on the downstream side of the cooling air, i.e., on the air discharge port side.

To allow the cooling air to intensively flow, on the downstream side, in the DIMM areas 51-4 to 51-6, walls are arranged in accordance with the arrangements of the DIMM areas 51-4 to 51-6 in each of the ducts 71 and positions corresponding to the air discharge ports of the DIMM areas other than the DIMM areas 51-4 to 51-6 are covered.

With these ducts 71, the cooling air flowing on the downstream side of the printed circuit board 40 can be concentrated in the DIMM areas 51-4 to 51-6, thereby it is possible to efficiently cools the DIMMs arranged on the downstream side where the temperature is higher than the upstream side.

Furthermore, by arranging a duct that efficiently allows the cooling air to make contact on the upstream side, i.e., make contact along some of the DIMM area on the air intake port side, the cooling effect can be further improved.

Figure 12:
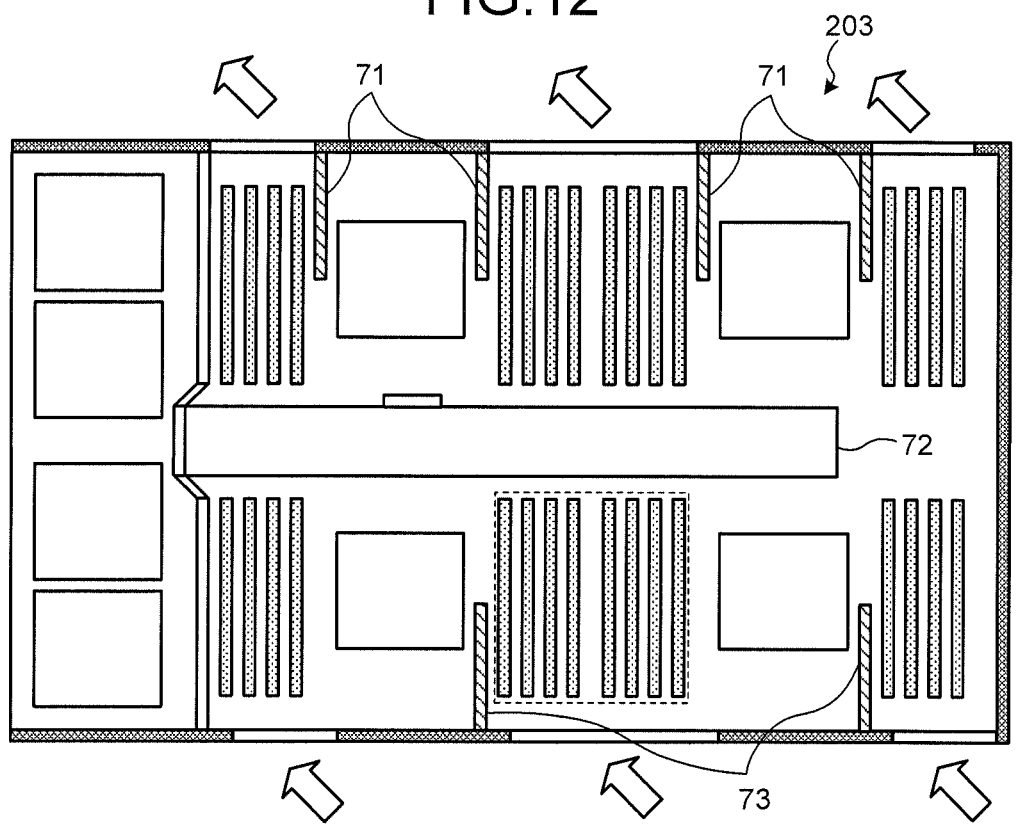
FIG. 12 is a schematic diagram illustrating a system board in which ducts are arranged on the air discharge port side and the air intake port side.

FIG. 12 is a schematic diagram illustrating a system board in which ducts are arranged on the air discharge port side and the air intake port side. The system board 203 illustrated in FIG. 12 includes ducts 73 on the downstream side of the DIMM area 51-1 and the DIMM area 51-3. The cooling air that is introduced in a direction that is oblique with respect to the system board 203 changes its flow direction when the cooling air makes contact with the ducts 73 and cools the DIMMs, and thus the cooling effect is improved.

Figure 13:
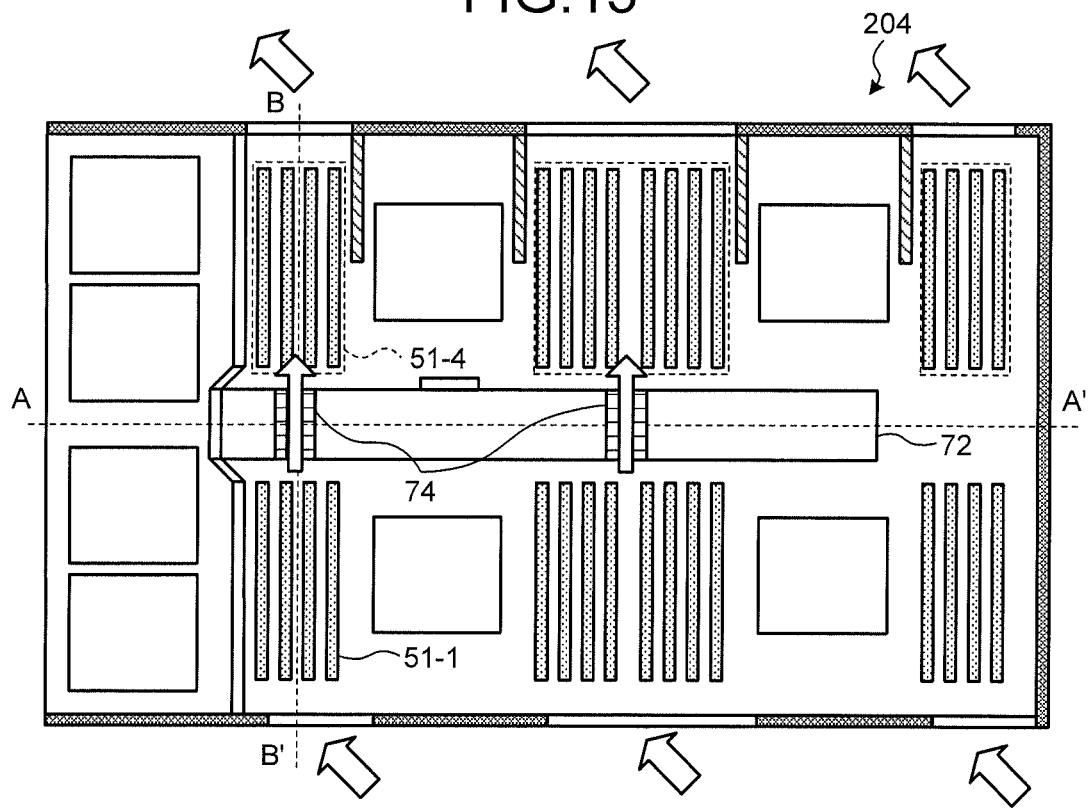
FIG. 13 is a schematic diagram illustrating the duct 72 in which an air guiding duct is arranged.
Figure 14:
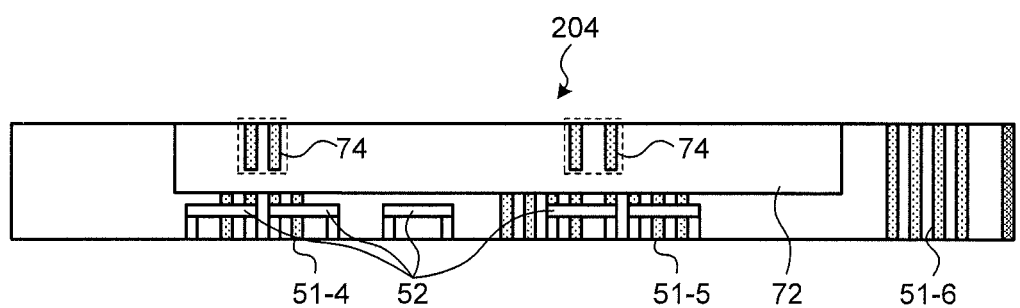
FIG. 14 is a sectional view of a system board 204 taken along line A-A' in FIG. 13.
Figure 15:
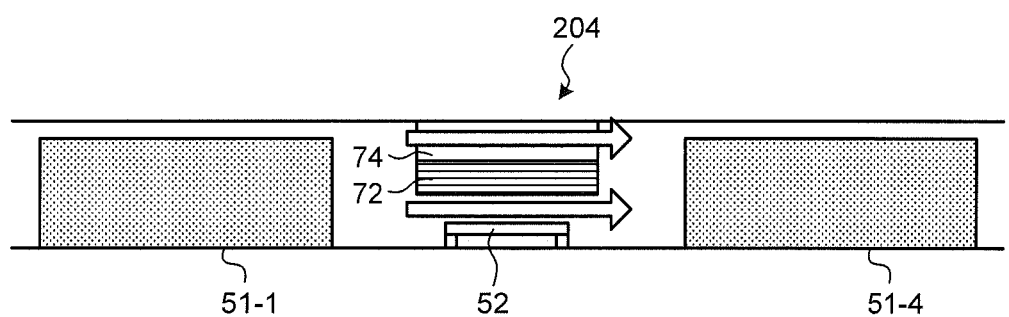
FIG. 15 is a sectional view of the system board 204 taken along line B-B' in FIG. 13.

FIG. 13 is a schematic diagram illustrating the duct 72 in which an air guiding duct is arranged. FIG. 14 is a sectional view of a system board 204 taken along line A-A' in FIG. 13. FIG. 15 is a sectional view of the system board 204 taken along line B-B' in FIG. 13.

The system board 204 illustrated in FIGS. 13 to 15 includes the duct 72 for cooling the power supply board 52 between the DIMM areas 51-1 to 51-3 arranged on the upstream side and the DIMM areas 51-4 to 51-6 arranged on the downstream side. Then, an air guiding duct 74, i.e., a local tunnel, is arranged near each of the center of the DIMM areas 51-4 and 51-5 in which the duct 72 is arranged. This air guiding duct 74 can allow the cooling air that is not affected by heat generated from the power supply board 52 to be supplied in the DIMM area on the downstream side.

Figure 16:
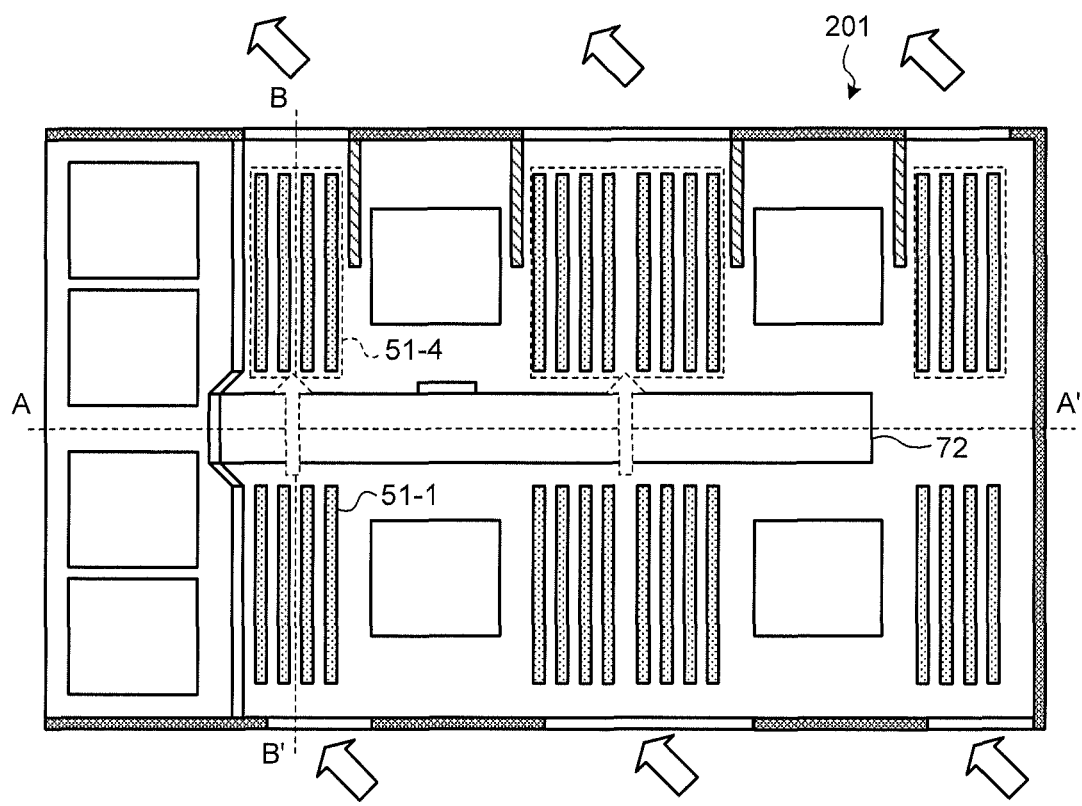
FIG. 16 is a schematic diagram illustrating the system board 201 in which the duct 72 that does not have an air guiding duct is arranged.
Figure 17:
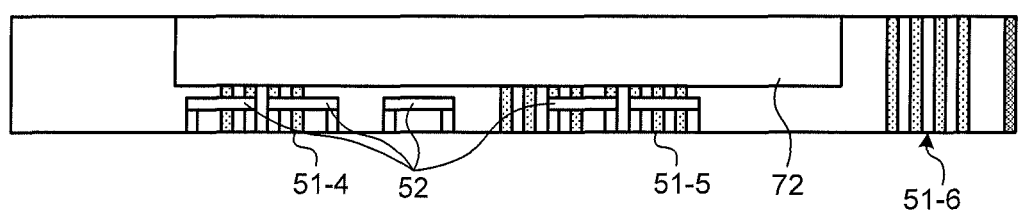
FIG. 17 is a sectional view of the system board 201 taken along line A-A' in FIG. 16.
Figure 18:
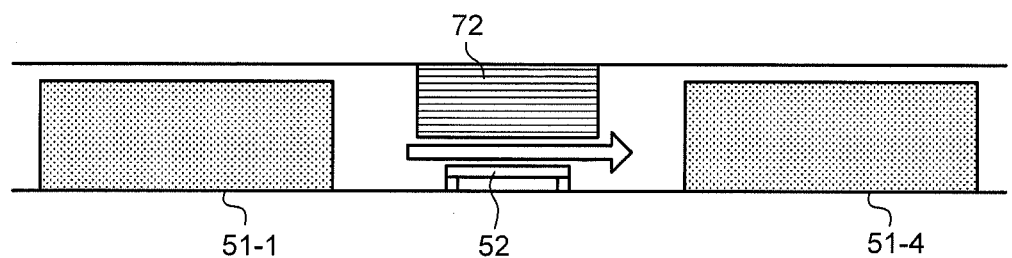
FIG. 18 is a sectional view of the system board 201 taken along line B-B' in FIG. 16.

In the following, as a comparative example of the system board 204, a case will be described in which the duct 72 that does not have an air guiding duct is arranged on the system board 201. FIG. 16 is a schematic diagram illustrating the system board 201 in which the duct 72 that does not have an air guiding duct is arranged. FIG. 17 is a sectional view of the system board 201 taken along line A-A' in FIG. 16. FIG. 18 is a sectional view of the system board 201 taken along line B-B' in FIG. 16.

With the duct 72 that does not have an air guiding duct, the cooling air is supplied to the DIMM area on the downstream side via the vicinity of the power supply board 52. Accordingly, the temperature of the cooling air rises due to the heat generated from the power supply board 52.

Figure 19:
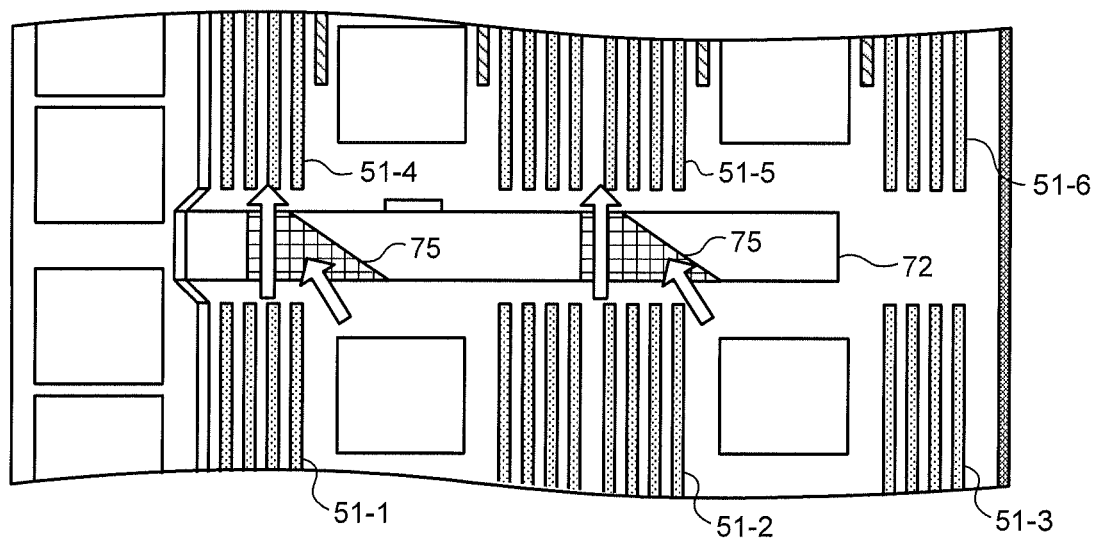
FIG. 19 is a schematic diagram illustrating a specific example of the structure of an air guiding duct that has an angle on one side.
Figure 20:
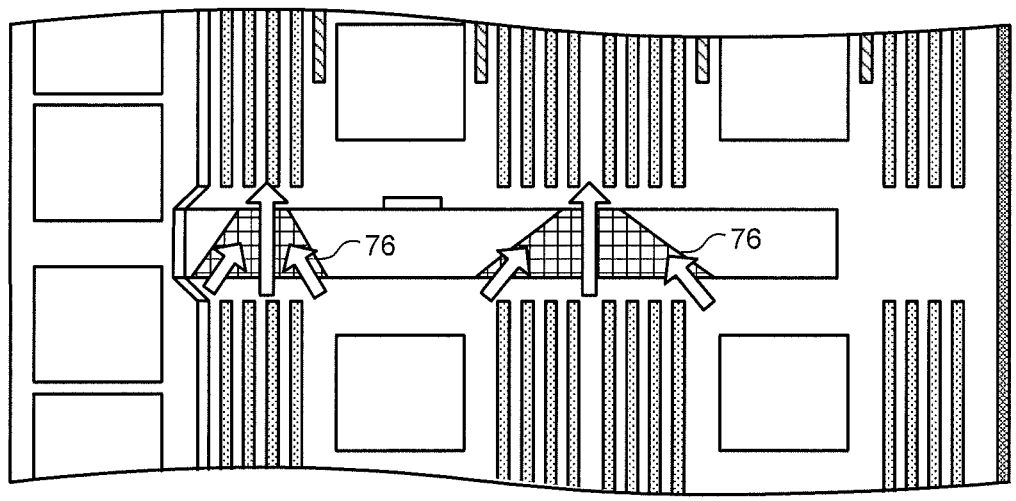
FIG. 20 is a schematic diagram illustrating a specific example of the structure of an air guiding duct that has angles on both sides.

In the following, a modification of the shape of the air guiding duct will be described. FIGS. 19 and 20 illustrate specific examples of the structure in which the air guiding ducts have an angle (taper). Each of air guiding ducts 75 illustrated in FIG. 19 has an air intake opening that is greater than an air discharge opening. Specifically, each of the air guiding ducts 75 has an angle on one end. The angle preferably has an angle on the upstream side in the direction in which the cooling air flows.

The configuration of air guiding ducts 76 illustrated in FIG. 20 is the same as that of each of the air guiding ducts 75 in that the air intake opening is greater than the air discharge opening; however, each of the air guiding ducts 76 has an angle on both sides of the air guiding duct. Accordingly, the cooling air can be supplied to the air discharge port by collecting the cooling air from all of the corresponding DIMM areas.

By making the air intake opening greater than the air discharge opening as with the air guiding ducts 75 and the air guiding ducts 76, the flow velocity of the cooling air supplied on the air discharge side increases, thus improving the cooling efficiency.

As described above, the system board 202 according to the second embodiment includes the ducts 71 functioning as straightening vanes of the cooling air in the vicinity of the electronic components arranged on the downstream side. The duct 71 can reduce a temperature rise of the electronic components arranged on the air discharge side where the temperature tends to rise compared with the temperature on the air intake side, and thus it is possible to efficiently and uniformly cool all of the electronic components mounted on the system board 202.

Furthermore, the system board 202 according to the second embodiment includes the ducts 73 functioning as straightening vanes of the cooling air in the vicinity of the electronic components arranged on the upstream side. With the ducts 73, it is possible to control the cooling air on the air intake side and thus is possible to reduce the temperature rise of the electronic components arranged on the air discharge side, thus efficiently and uniformly cooling all of the electronic components mounted on the system board 203.

Furthermore, for the electronic components arranged on the downstream side where the temperature becomes relatively high due to the temperature rise of the electronic components arranged on the upstream side, the system board 202 according to the second embodiment increases the flow velocity of the cooling air by focusing the flow of the cooling air to the midpoint between the upstream side and the downstream side. Accordingly, even when the cooling air whose temperature rises due to the heat generated from the electronic components arranged on the upstream side makes contact with the electronic components arranged on the downstream side, it is possible to remove the heat generated from the electronic components arranged on the downstream side as much as possible.

Furthermore, by installing the system boards 202 and 203 according to the second embodiment in a server, it is possible to reduce the heat generated from the entire server.

[c] Third Embodiment

Figure 21:
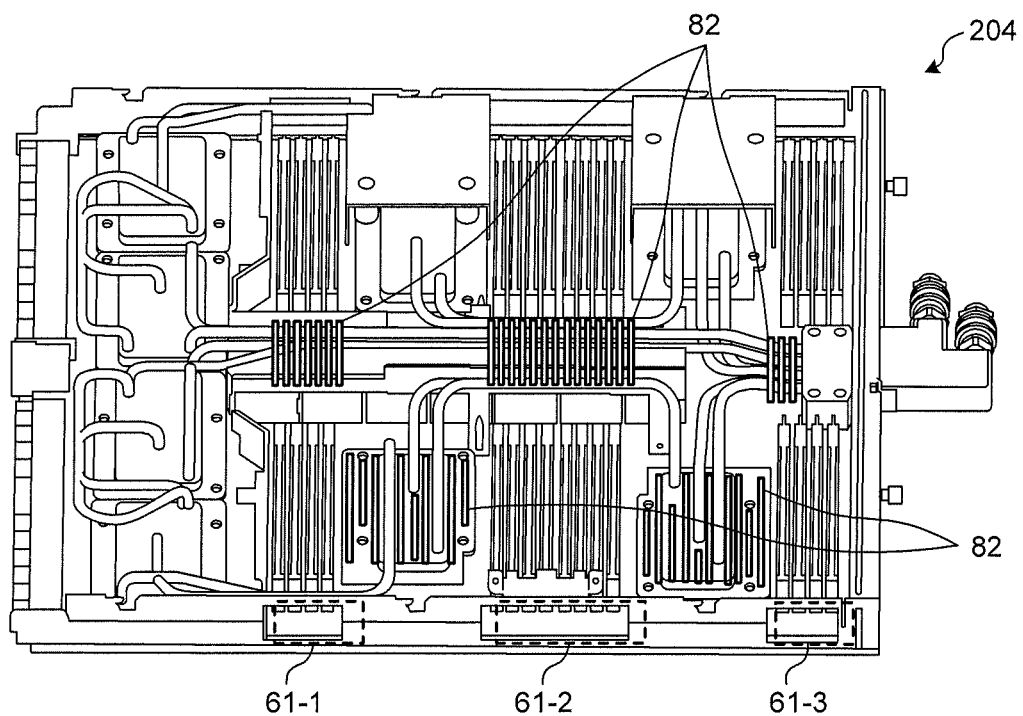
FIG. 21 is a schematic diagram illustrating the configuration of a system board that is an electronic device according to a third embodiment.

FIG. 21 is a schematic diagram illustrating the configuration of a system board that is an electronic device according to a third embodiment. The system board 204 illustrated in FIG. 21 has the structure in which fins 82 are arranged in the water cooling jackets 81 and the water cooling pipes. Because the configuration of the system boards according to the third embodiment is the same as that of the system boards 201 to 203 described in the first and second embodiments, components that are the same as those in the first and second embodiments are assigned the same reference numerals; therefore, a description thereof is omitted.

The temperature of the water cooling jackets 81 and the water cooling pipe is lower than that of the DIMMs. Accordingly, with the system board 204, the cooling air introduced from the air intake port is cooled by making contact with the fin 82. Accordingly, the cooling air can efficiently cools the DIMM.

Figure 22:
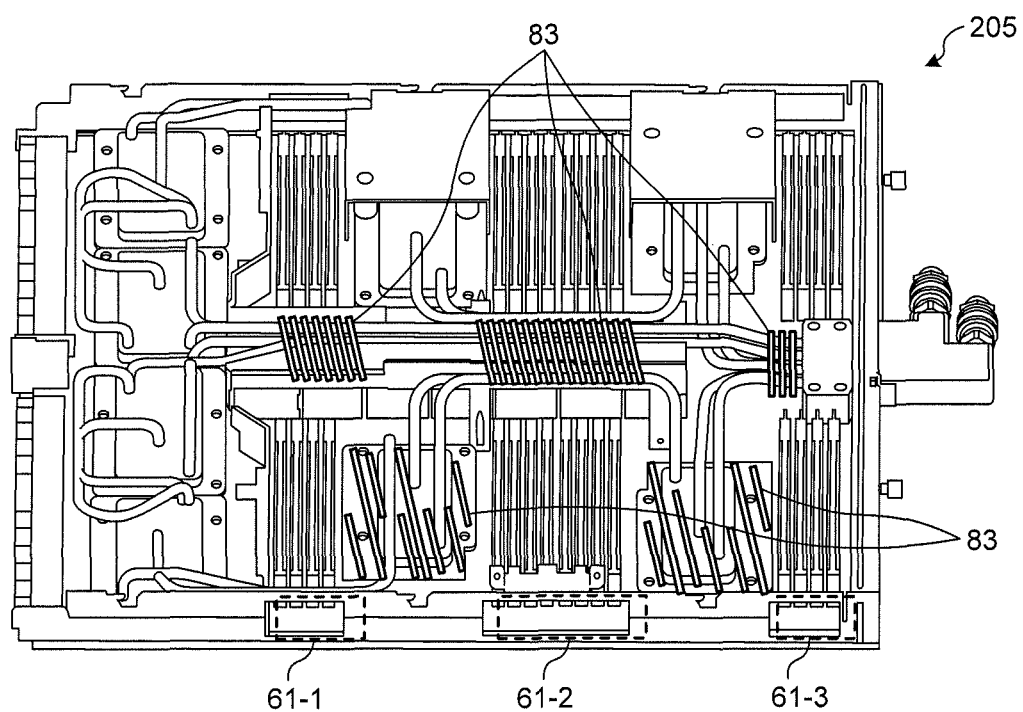
FIG. 22 is a schematic diagram illustrating of the structure of fins that have an angle corresponding to the inflow angle of cooling air.

FIG. 22 is a schematic diagram illustrating of the structure of fins that have an angle corresponding to the inflow angle of cooling air. With a system board 205 illustrated in FIG. 22, fins 83 have an angle corresponding to an inflow angle of the cooling air. Accordingly, it is possible to reduce the flow velocity of the cooling air when the cooling air makes contact with the fins 83, thus cooling the DIMMs with cooling air having the high velocity and low temperature.

As described above, for the electronic components arranged on the downstream side where the temperature becomes relatively high due to the temperature rise of the electronic components arranged on the upstream side, the system boards 204 and 205 according to the third embodiment decreases the temperature of the cooling air by allowing the water cooling jackets 81, i.e., a cooling structure part, arranged on the upstream side of the electronic components that are arranged on the downstream to efficiently cool and by passing the cooling air flowing therein through the cooling structure part.

By cooling the temperature of the cooling air using the water cooling jackets or the cooling tubes in this way and by causing the cooling air having a lower temperature to make contact with the electronic components arranged on the downstream side of the water cooling jackets or the cooling tubes, it is possible to improve the cooling efficiency of the components to be cooled.

Furthermore, by installing the system boards 202 and 203 according to the second embodiment in a server, it is possible to reduce the heat generated from the entire server.

As described in the above embodiments, with the electronic device and the complex electronic device disclosed in the present invention, by offsetting the inlet of the cooling air, the inflow of the cooling air is performed smoothly, and thus it is possible to more efficiently and more uniformly bring the cooling air into contact with the electronic components to be cooled.

Furthermore, by controlling the direction or the velocity of the cooling air in accordance with the arrangement of the ducts and by using the cooling of the cooling air itself generated by using the cooling structure parts, the effect of the cooling is further improved, and thus cooling is efficiently performed.

Accordingly, because the heat-generating components mounted on the electronic device can be uniformly cooled, the variation in the temperature of the components can be reduced, and thus the reliability of the components is improved. Furthermore, by efficiently performing the cooling, an amount of inefficient cooling air can be reduced. Accordingly, the number of fans that send the cooling air can be reduced, thus saving electrical power, reducing noises, and reducing the size of the structure.

The first, second, and third embodiments are only for an example; therefore, the disclosed technology can be used by appropriately being changed. For example, in the first, second, and third embodiments, a case has been described in which an amount of offset of the air intake port is fixed. However, the amount of offset of the air intake port can be changed by arranging a sliding window member at the air intake port.

According to one aspect of the electronic device and the complex electronic device disclosed by this application, the electronic device and the complex electronic device efficiently cool a heat-generating component by supplying cooling air at an angle that is oblique with respect to a wall of a casing of the electronic device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a circuit board having a component mounted thereon;
   a first side plate that includes an air intake port that introduces cooling air over the circuit board; and
   a second side plate that includes an air discharge port that discharges the cooling air from the circuit board, wherein
   the first side plate includes the air intake port at a position shifted from a position closest to the component,
   a direction in which the position of the air intake port is shifted corresponds to an angle of an intake stream of the cooling air with respect to the first side plate,
   the cooling air is supplied via an air intake duct at a predetermined angle that is greater than 0 degrees and less than 90 degrees with respect to the air intake port, and
   the first side plate includes the air intake port at the position where a center of the air intake port in a lengthening direction of the first side plate is arranged by offsetting toward an upstream side of the cooling air supplied to the air intake port against a center of the component in the lengthening direction of the first side plate.

2. The electronic device according to claim 1, wherein
   the component is a plurality of components that are distributed and arranged on the circuit board, the plurality of components having component centers, and
   the air intake port is a plurality of air intake ports that are arranged on the first side plate, the plurality of components having intake port centers, wherein
   the intake port centers the plurality of air intake ports in the lengthening direction of the first side plate is arranged by offsetting toward the upstream side of the cooling air supplied to the plurality of air intake ports against the component centers of the plurality of components in the lengthening direction of the first side plate.

3. The electronic device according to claim 1, further comprising a duct at the air discharge port to adjust a flow of the cooling air.

4. The electronic device according to claim 1, further comprising an air guiding member that collects the cooling air flowing on an air intake port side of the circuit board and that supplies the collected cooling air onto an air discharge port side of the circuit board.

5. The electronic device according to claim 1, further comprising a fin that causes the cooling air to make contact with a second component whose temperature is lower than that of the component.

6. The electronic device according to claim 5, wherein the fin has an angle corresponding to the angle of the intake stream of the cooling air with respect to the first side plate.

7. A complex electronic device comprising:
one or a plurality of electronic devices that has a circuit board having a component mounted thereon;
an air intake duct that supplies the cooling air at a predetermined angle that is greater than 0 degrees and less than 90 degrees with respect to an air intake port that is arranged on a first side plate of the one or more electronic devices;
an air discharge duct that discharges the cooling air discharged from an air discharge port that is arranged on a second side plate of the one or more electronic devices; and
a cooling device that is arranged at least either one of a position between the one or more electronic devices and the air intake duct or a position between the one or more electronic devices and the air discharge duct and that generates the cooling air, wherein
the one or more electronic devices has the air intake port at a position, on the first side plate, shifted from a position closest to the component to another position on the air intake duct side, and
the first side plate includes the air intake port at the position where a center of the air intake port in a lengthening direction of the first side plate is arranged by offsetting toward an upstream side of the cooling air supplied to the air intake port against a center of the component in the lengthening direction of the first side plate.

8. The complex electronic device according to claim 7, wherein
the component is a plurality of components that are distributed and arranged on the circuit board, the plurality of components having component centers, and
the air intake port is a plurality of air intake ports that arranged on the first side plate, the plurality of components having intake ports centers, wherein
the intake port centers of the plurality of air intake ports in the lengthening direction of the first side plate is arranged by offsetting toward the upstream side of the cooling air supplied to the plurality of air intake ports against the component centers of the plurality of components in the lengthening direction of the first side plate.

9. The complex electronic device according to claim 7, further comprising a duct at the air discharge port to adjust a flow of the cooling air.

10. The complex electronic device according to claim 7, further comprising an air guiding member that collects the cooling air flowing on an air intake port side of the circuit board and that supplies the collected cooling air onto an air discharge port side of the circuit board.

11. The complex electronic device according to claim 7, further comprising a fin that causes the cooling air to make contact with a second component whose temperature is lower than that of the component.

12. The complex electronic device according to claim 11, wherein the fin has an angle corresponding to a predetermined angle of an intake stream of the cooling air.

* * * * *

UNITED STATES PATENT AND TRADEMARK OFFICE
CERTIFICATE OF CORRECTION

PATENT NO. : 8,817,470 B2
APPLICATION NO. : 13/447515
DATED : August 26, 2014
INVENTOR(S) : Nobumitsu Aoki et al.

It is certified that error appears in the above-identified patent and that said Letters Patent is hereby corrected as shown below:

In the Claims

Column 12, Line 59, In Claim 2, before "the plurality" insert -- of --.

Column 13, Line 16 (Approx.), In Claim 7, after "supplies" delete "the".

Column 13, Line 25, In Claim 7, delete "at least" and insert -- at at least --, therefor.

Column 14, Line 10, In Claim 8, after "that" insert -- are --.

Signed and Sealed this
Twenty-third Day of December, 2014

Michelle K. Lee
*Deputy Director of the United States Patent and Trademark Office*